US008021971B2

(12) United States Patent
Domenicucci et al.

(10) Patent No.: US 8,021,971 B2
(45) Date of Patent: Sep. 20, 2011

(54) STRUCTURE AND METHOD TO FORM A THERMALLY STABLE SILICIDE IN NARROW DIMENSION GATE STACKS

(75) Inventors: Anthony G. Domenicucci, Hopewell Junction, NY (US); Christian Lavoie, Yorktown Heights, NY (US); Ahmet S. Ozcan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/611,946

(22) Filed: Nov. 4, 2009

(65) Prior Publication Data

US 2011/0101472 A1     May 5, 2011

(51) Int. Cl.
*H01L 21/3205* (2006.01)
*H01L 29/861* (2006.01)

(52) U.S. Cl. ........ 438/592; 438/303; 438/305; 438/492; 438/581; 257/262; 257/327; 257/336; 257/383; 257/384; 257/388; 257/E21.085; 257/E21.119; 257/E21.409; 257/E21.438

(58) Field of Classification Search .................. 438/303, 438/305, 492, 581, 592; 257/262, 327, 336, 257/383, 384, 388, E21.085, E21.119, E21.409, 257/E21.438, E21.439
See application file for complete search history.

(56) References Cited

U.S. PATENT DOCUMENTS

| 7,385,260 B2* | 6/2008 | Kwon et al. | 257/383 |
| 7,563,700 B2* | 7/2009 | Srivastava et al. | 438/592 |
| 2002/0145156 A1* | 10/2002 | Igarashi et al. | 257/262 |
| 2006/0091459 A1* | 5/2006 | Li | 257/336 |
| 2010/0078706 A1* | 4/2010 | Matsuda | 257/326 |

* cited by examiner

*Primary Examiner* — Dao H Nguyen
(74) *Attorney, Agent, or Firm* — Ian D. MacKinnon (57) ABSTRACT

An integrated circuit is provided including a narrow gate stack having a width less than or equal to 65 nm, including a silicide region comprising Pt segregated in a region of the silicide away from the top surface of the silicide and towards an lower portion defined by a pulldown height of spacers on the sidewalls of the gate conductor. In a preferred embodiment, the spacers are pulled down prior to formation of the silicide. The silicide is first formed by a formation anneal, at a temperature in the range 250° C. to 450° C. Subsequently, a segregation anneal at a temperature in the range 450° C. to 550° C. The distribution of the Pt along the vertical length of the silicide layer has a peak Pt concentration within the segregated region, and the segregated Pt region has a width at half the peak Pt concentration that is less than 50% of the distance between the top surface of the silicide layer and the pulldown spacer height.

30 Claims, 14 Drawing Sheets

STRUCTURE AND METHOD TO FORM A THERMALLY STABLE SILICIDE IN NARROW DIMENSION GATE STACKS

FIELD OF THE INVENTION

The present invention broadly relates to the manufacture of integrated circuits, and particularly to Front-End of the Line (FEOL) processing, and more particularly to a method and structure for manufacturing a silicide in field effect transistors (FETs) having narrow gate lengths.

BACKGROUND

The use of silicide as a contact material is well-known in the manufacture of CMOS (Complementary metal-oxide semiconductor) devices such as FETs (field-effect transistors). The silicide provides a material with relatively low sheet resistance, which also leads to relatively low contact resistance, to the FET source/drain regions and to the gate conductor. A low sheet resistance allows good current flow within the silicide, while a low contact resistance allows a good electrical connection to the contact, e.g. a tungsten plug, that is used to connect to the wiring layers. A typical silicide material is NiSi. It is also known that alloying elements, such as Pt, may be used to enhance the thermal stability of the silicide during subsequent processing. However, alloy materials such as Pt increase the sheet resistance, and therefore also the contact resistance, of the silicide.

Figure 1:
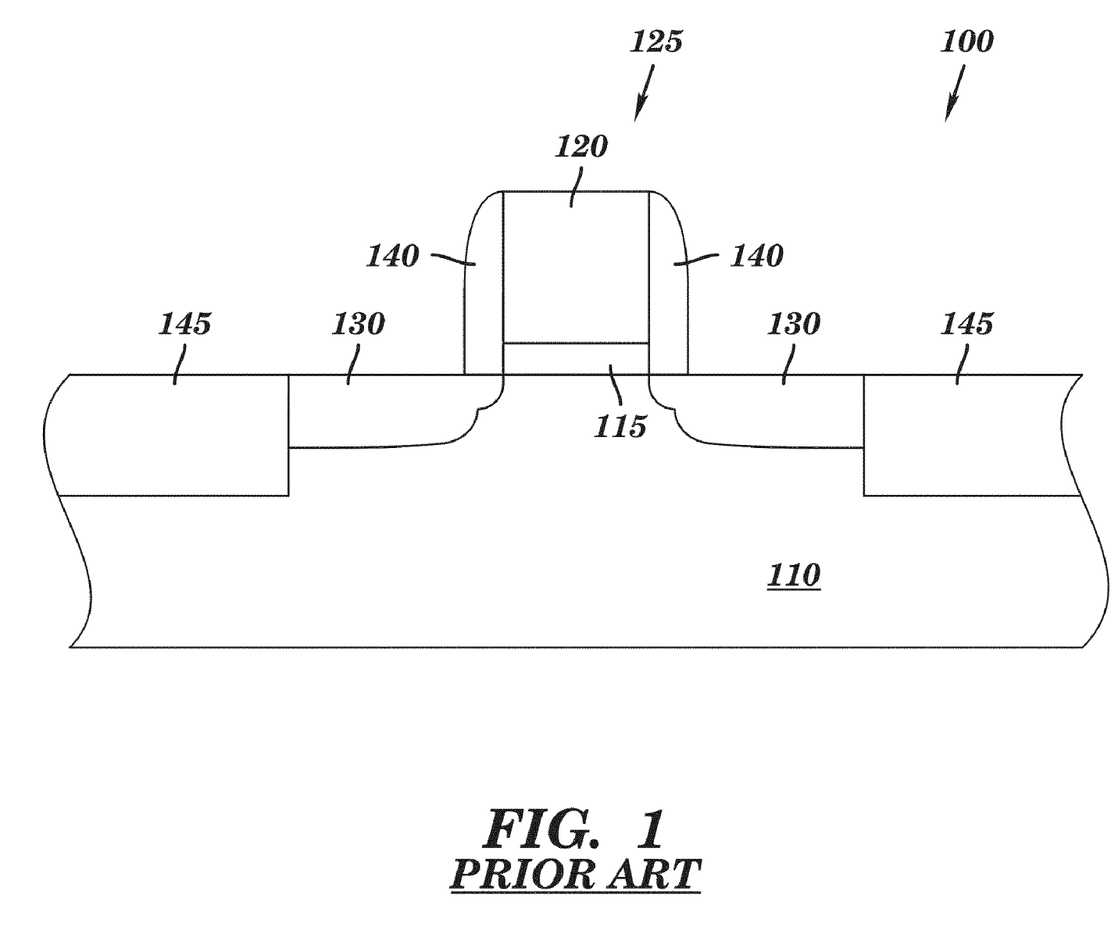
FIGS. 1-4 illustrate cross-sections of a structure during a prior art process of forming a FET device.

For example, consider a conventional method of forming a CMOS device. FIG. 1 illustrates a typical CMOS FET at an intermediate stage of processing. The wafer 100 includes a semiconductor substrate 110, such as Si, SiGe, silicon on insulator (SOI), and the like. Shallow trench isolation (STI) regions 145 are formed. A gate stack 125 is formed over the substrate 110, comprising a gate conductor 120, such as a polysilicon gate conductor, formed atop a gate dielectric 115. The sidewalls of the gate stack are covered by dielectric spacers 140. Source/drain regions 130 are formed in the substrate adjacent the gate stack 125.

Figure 2:
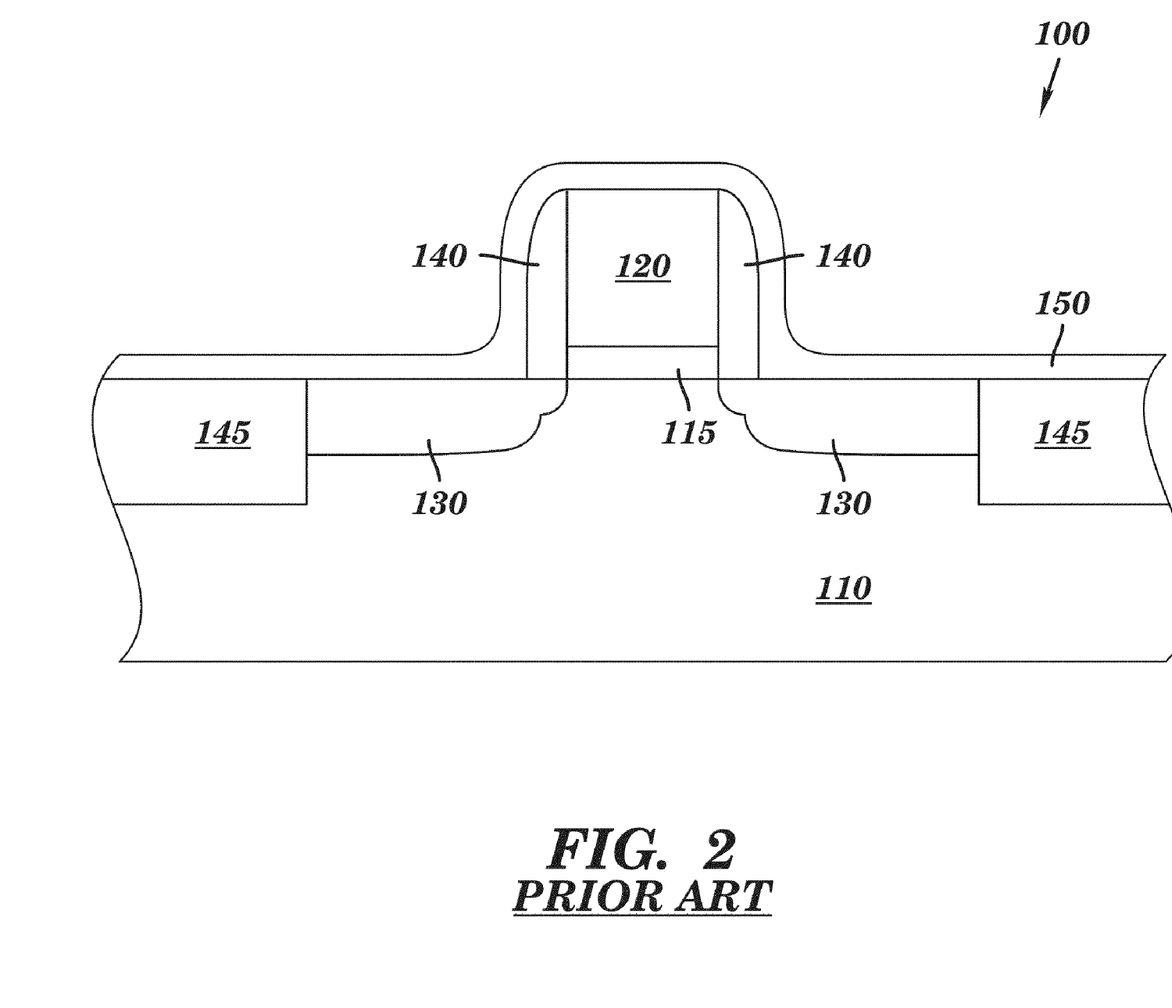

Referring to FIG. 2, a thin metal layer 150 is deposited over the surface of the wafer 100. For example, the thin metal layer may be a metal suitable for forming a silicide with the underlying semiconductor material in the substrate 110 and the gate conductor 120. In this example, $Ni_{1-x}Pt_x$ (x being the alloy percentage) may be used, where Pt is included to provide thermal stability.

Figure 3:
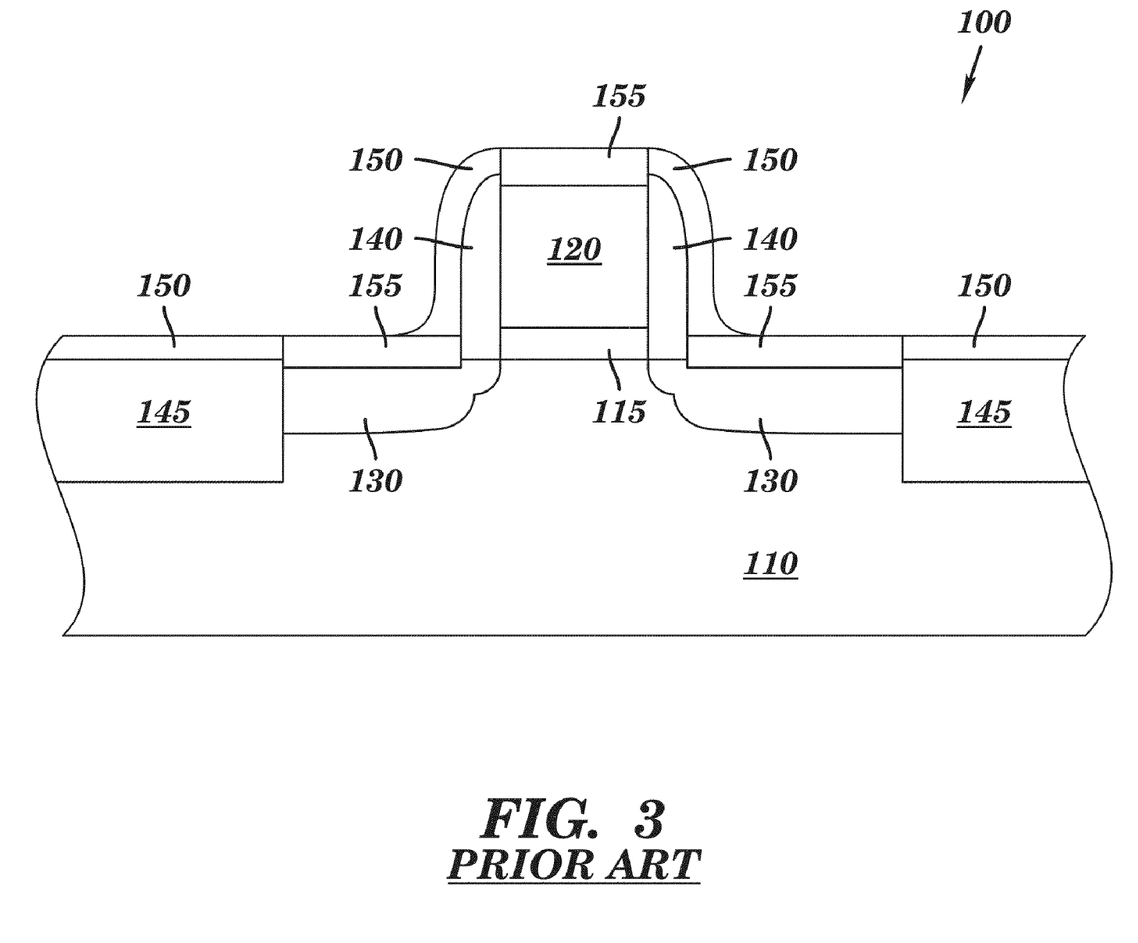

Next, the wafer is annealed, for example, at a temperature in the range 250-450° C. The $Ni_{1-x}Pt_x$ will selectively react with the semiconductor, e.g. Si, in the gate conductor 120 and the substrate source/drain regions 130, to form silicide layers 155. The $Ni_{1-x}Pt_x$ will not react with the dielectric spacers 140 or the STI regions 145, thus the silicide layers 155 are self-aligned. This selective, self-aligned silicide process is often referred to as a salicide process. The resulting structure is illustrated in FIG. 3.

Figure 4:
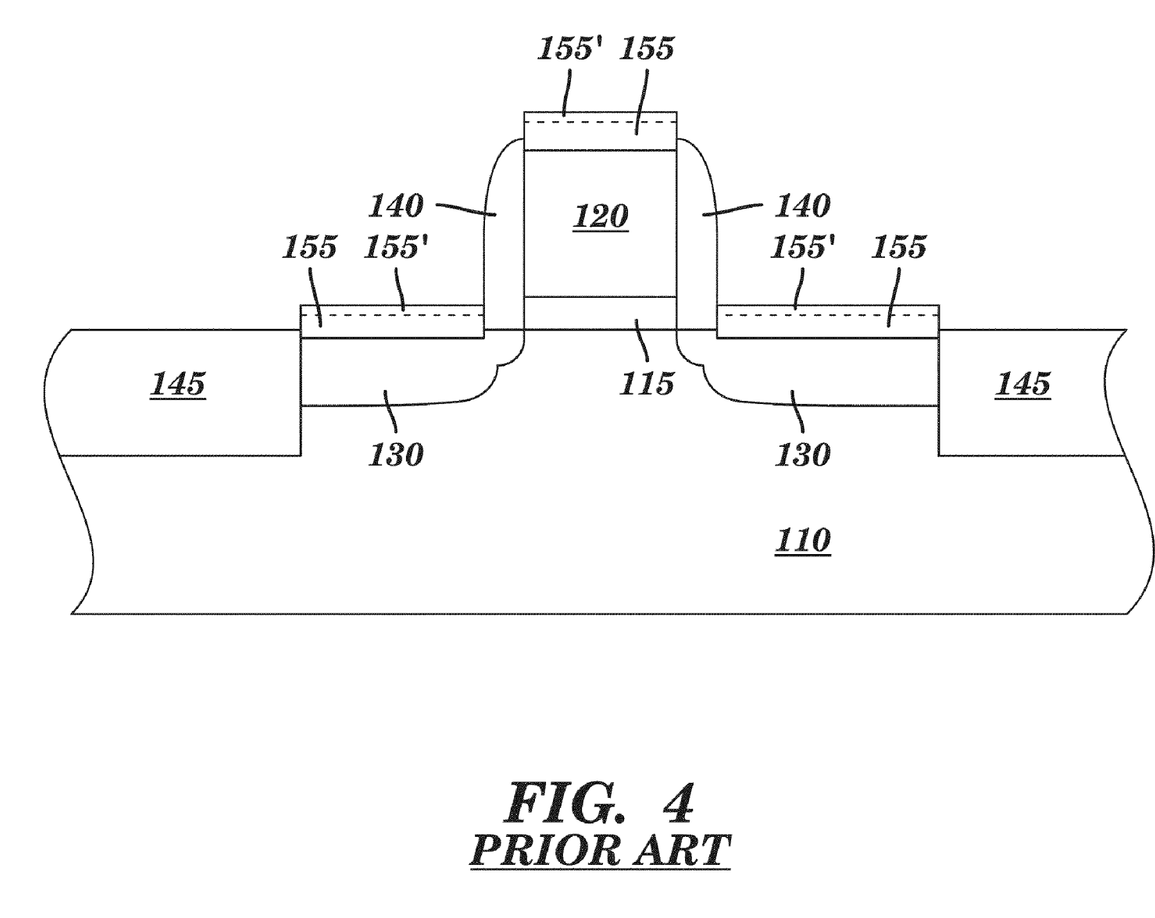

Next, the unreacted $Ni_{1-x}Pt_x$ metal is removed, for example, by a selective wet etch, leaving the $Ni_{1-x}Pt_x$ silicide 155 atop the gate conductor 120 and the source/drain regions 130, as illustrated in FIG. 4. However, particularly in devices having narrow (i.e. less than about 65 nm) gate dimensions, segregation of Pt will tend to occur in an upper portion 155' of the $Ni_{1-x}Pt_x$ silicide 155. This has the disadvantage of increasing the sheet resistance of the silicide. For example, 10% Pt will increase the sheet resistance of the silicide by about 50%.

As devices continue to scale to smaller dimensions, it would be desirable to provide a silicide that has good thermal stability while also providing low contact resistance and low sheet resistance.

SUMMARY OF THE INVENTION

An integrated circuit is provided including a narrow gate stack having a width less than or equal to 65 nm, including a silicide region comprising Pt segregated in a region of the silicide away from the top surface of the silicide and towards an lower portion defined by a pulldown height of spacers on the sidewalls of the gate conductor. In a preferred embodiment, the spacers are pulled down prior to formation of the silicide. The silicide is first formed by a formation anneal, at a temperature in the range 250° C. to 450° C. Subsequently, a segregation anneal at a temperature in the range 450° C. to 550° C. The distribution of the Pt along the vertical length of the silicide layer has a peak Pt concentration within the segregated region, and the segregated Pt region has a width at half the peak Pt concentration that is less than 50% of the distance between the top surface of the silicide layer and the pulldown spacer height.

The present invention provides a method for manufacturing a semiconductor device, the method comprising the steps of: providing a wafer comprising a semiconductor substrate, a gate stack formed atop the substrate, including a semiconductor gate conductor, having a width less than or equal to 65 nm, and dielectric spacers covering the sidewalls of the gate conductor while leaving the top surface of the gate conductor exposed; pulling down the dielectric spacers to a pulldown spacer height; forming a thin metal layer over the wafer at least atop the exposed top surface and upper portion of the sidewalls of the gate conductor, the thin metal layer comprising a nickel and a second metal; performing a formation anneal so that the thin metal layer reacts with the gate conductor to form a monosilicide layer; removing unreacted portions of the thin metal layer; and after removing said unreacted portions of the thin metal layer, performing a segregation anneal at a higher temperature than the formation anneal so at least 50% of the second metal is located in a segregated region in a lower half of said monosilicide layer between a top surface of said monosilicide layer and said pulldown spacer height.

In another aspect according to the invention, the second metal is selected from the group comprising Pt, Pd and Re. Preferably, the second metal is Pt.

In yet another aspect according to the invention, the distribution of said second metal along the vertical length of said monosilicide layer has a peak concentration within said segregated region, and said segregated region has a width at half said peak concentration that is less than 50% of the distance between said top surface of said monosilicide layer and said pulldown spacer height.

In yet a further aspect according to the invention, the formation anneal is performed at a temperature in the range 250° C. to 450° C. The formation anneal may be a two-step anneal.

In yet another aspect according to the invention, the segregation anneal is performed at a temperature in the range 450° C. to 550° C.

In yet another aspect according to the invention, an integrated circuit device is provided comprising: a gate stack comprising: a semiconductor gate conductor having a width of 65 nm or less; dielectric spacers on the sidewalls of said semiconductor gate conductor having a pulldown height at a height where a thickness of said dielectric spacers is at least one-tenth of the width of said semiconductor gate conductor;

and an alloy layer of said semiconductor gate conductor material and a first and second metal, said alloy layer disposed atop said semiconductor gate conductor and having a segregated region comprising at least 50% of the concentration of said second metal within said alloy layer located in a lower half of a portion of said alloy layer between a top surface of said alloy layer and said pulldown height.

The foregoing and other features and advantages of the invention will be apparent from the following detailed description of the invention.

BRIEF DESCRIPTION OF THE DRAWINGS

Referring to the exemplary drawings wherein like elements are numbered alike in the several figures, not necessarily drawn to scale, in which.

DETAILED DESCRIPTION OF THE INVENTION

A method and structure in accordance with the invention provides silicide over a gate conductor having thermal stability with low contact resistance.

Figure 5:
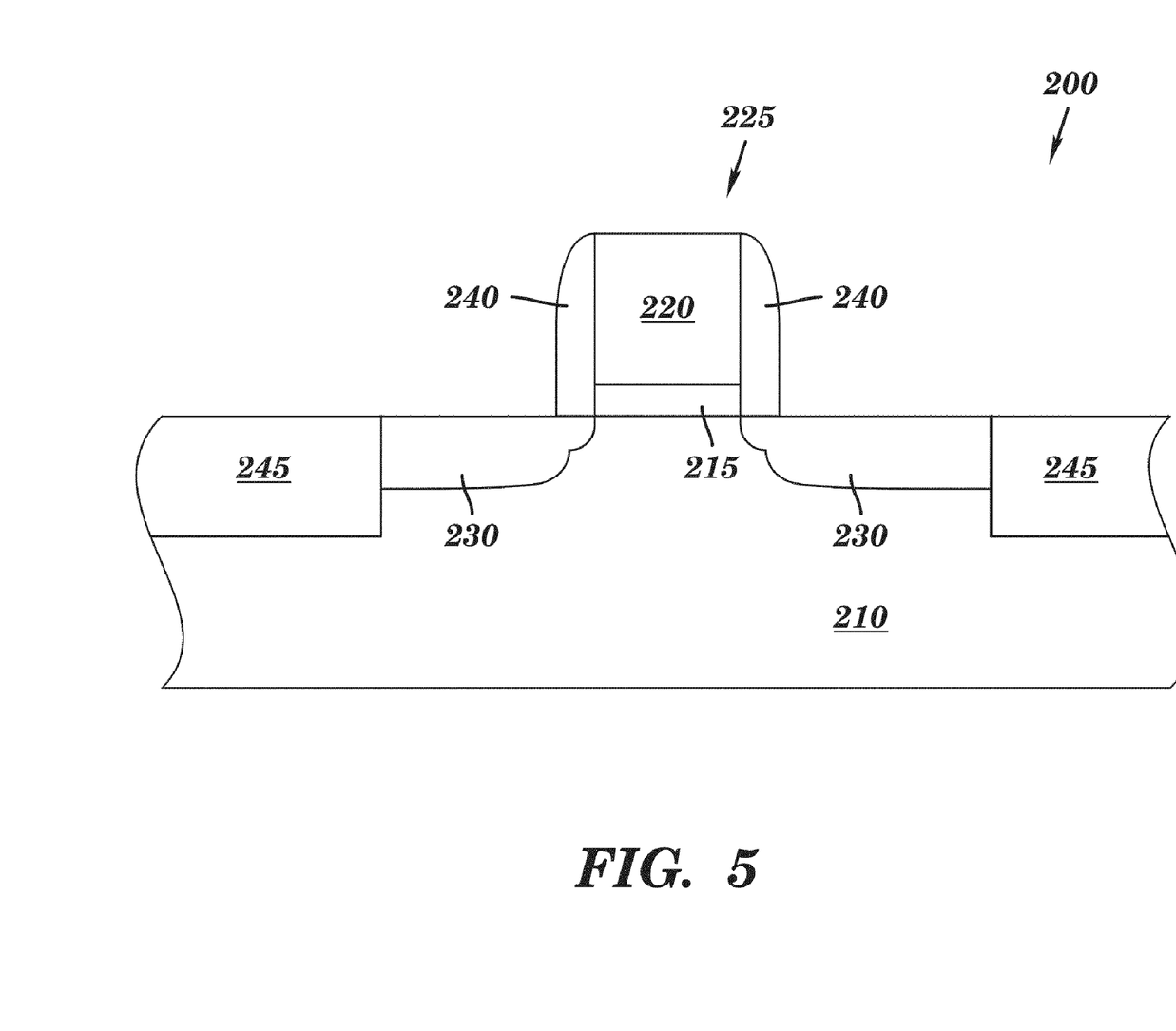
FIGS. 5-10 illustrate cross-sections of a structure during an embodiment of a method in accordance with the invention.

FIG. 5 illustrates a CMOS FET at an intermediate stage of processing. The wafer 200 includes a semiconductor substrate 210, such as Si, SiGe, silicon on insulator (SOI), and the like. Shallow trench isolation (STI) regions 245 are formed in the substrate 210. A gate stack 225 is formed over the substrate 110, comprising a semiconductor gate conductor 220, such as a polysilicon gate conductor, formed atop a gate dielectric 215. The sidewalls of the gate stack 225 are covered by dielectric spacers 240. The spacers 240 should have a thickness of at least about one-tenth of the width of the gate conductor 220. For example, for a gate width of 65 nm, the spacers 240 should have a thickness of at least 6.5 nm thick. Source/drain regions 230 are formed in the substrate adjacent the gate stack 225.

Figure 6:
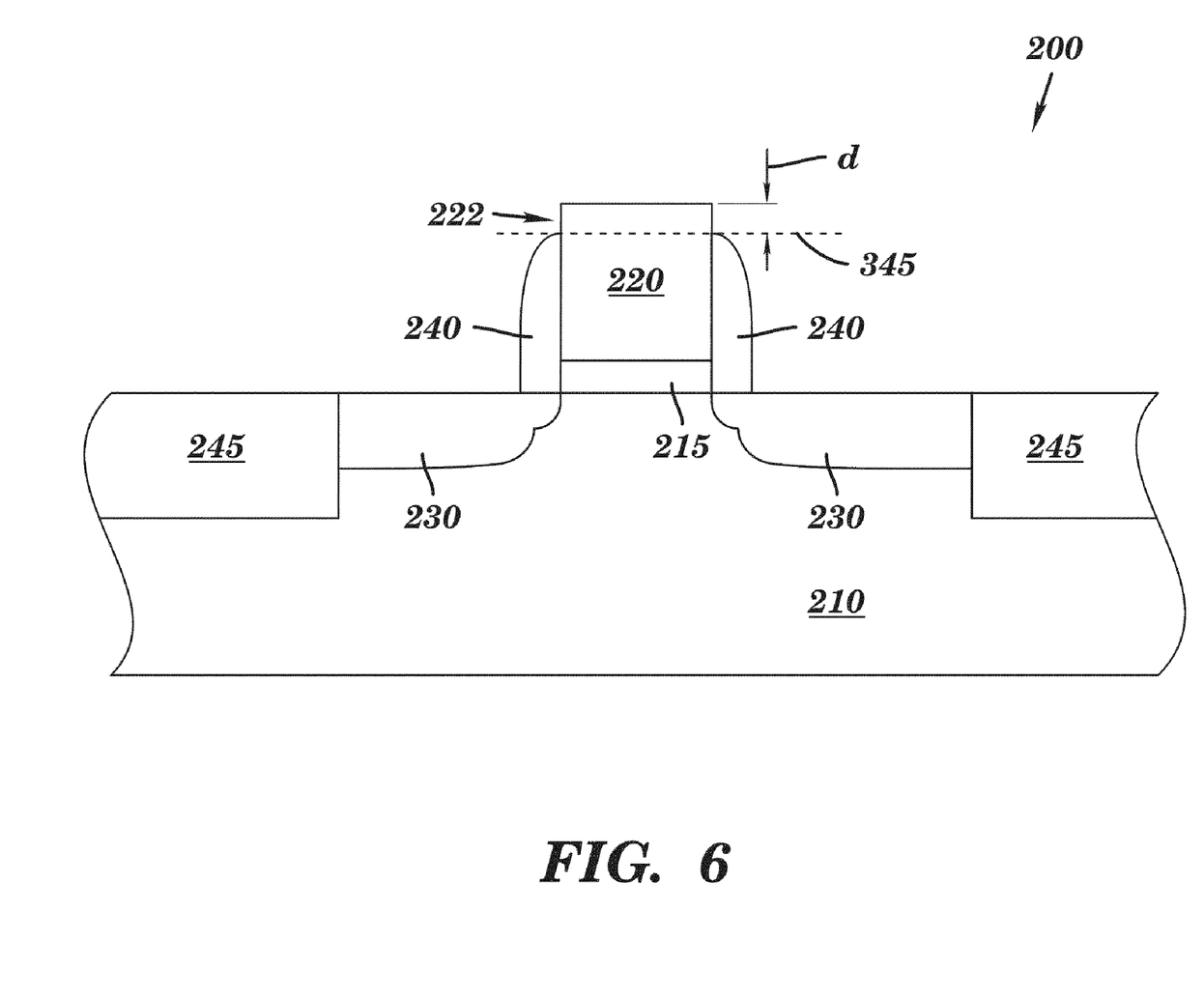

In accordance with the invention, the sidewall spacers 240 are pulled down to an approximate pulldown height 345 so as to expose an upper sidewall portion 222 of the gate conductor 220, as illustrated in FIG. 6. The amount of pulldown d of the pulled-down spacers 240 is preferably so that the thickness of the spacer is at least about one-tenth of the width of the gate conductor 220. The exposed upper sidewall portion 222 has an approximate height of d from the top level 345 of the spacers 240 (e.g. to the level where the minimum thickness of the spacers is about one-tenth of the width of the gate conductor 220) to the top of the gate conductor 220. The pull down distance d is such that a subsequently deposited metal layer, when annealed to form a monosilicide, will consume all of the gate conductor semiconductor (e.g. Si) volume above the spacers 240. Preferably, the pull down distance d should be at least as much as the thickness of the subsequently deposited metal layer. Preferably, the amount of pulldown d should not be greater than the height of the gate conductor. The ratio of the thickness of the deposited metal to the thickness of the monosilicide scales linearly. The pull down of the spacers 240 may be performed by a method such as reactive ion etch (RIE) and/or a wet chemical etch.

Figure 7:
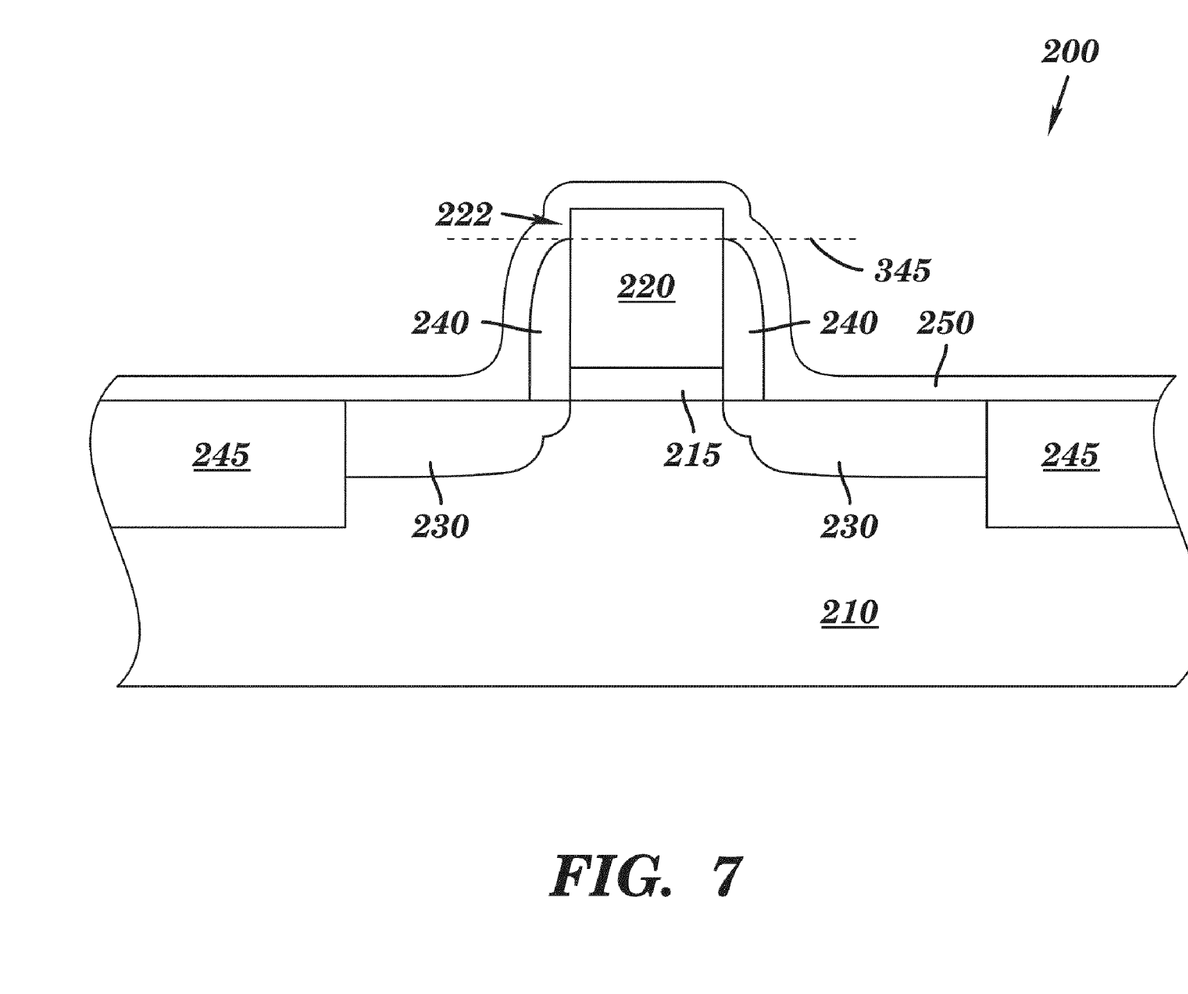

Next, referring to FIG. 7, a thin metal layer 250 is blanket deposited over the surface of the wafer 200. The metal layer 250 preferably comprises a mixture of nickel and a second metal. In a preferred embodiment, the metal layer 250 has the composition $Ni_{1-x}Pt_x$. The metal layer 250 may also comprise other suitable silicide materials, where the second metal may be a metal such as Pd, Re, and the like. Preferably, preferably the second metal is Pt, where the percent Pt is in the range between about 5 to 15%. The metal layer 250 may be deposited by methods such as sputter deposition, also called physical vapor deposition (PVD). The metal layer 250 has a thickness in the range 5 to 20 nm, and preferably in the range 8 to 12 nm.

Figure 8:
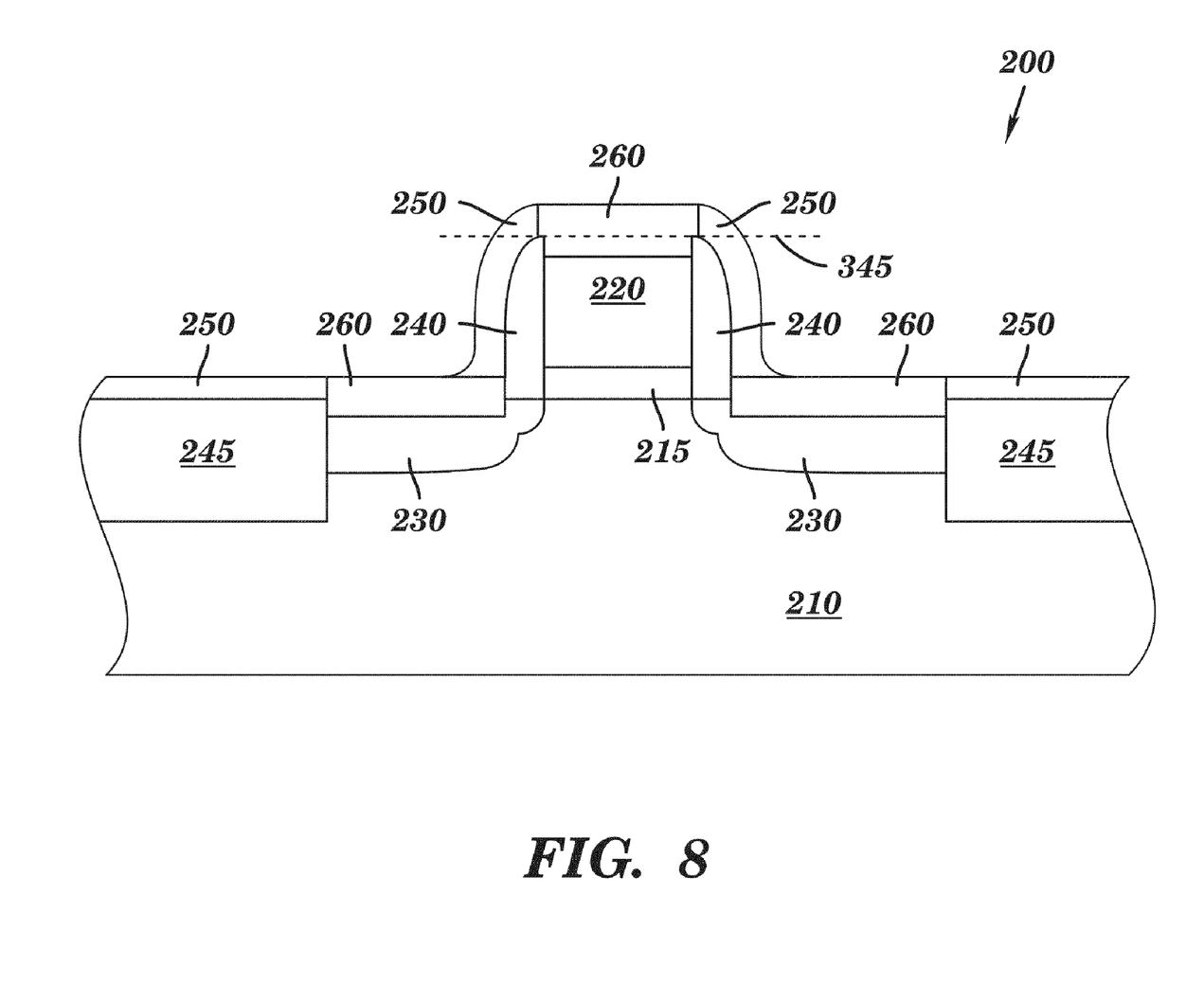
Figure 9:
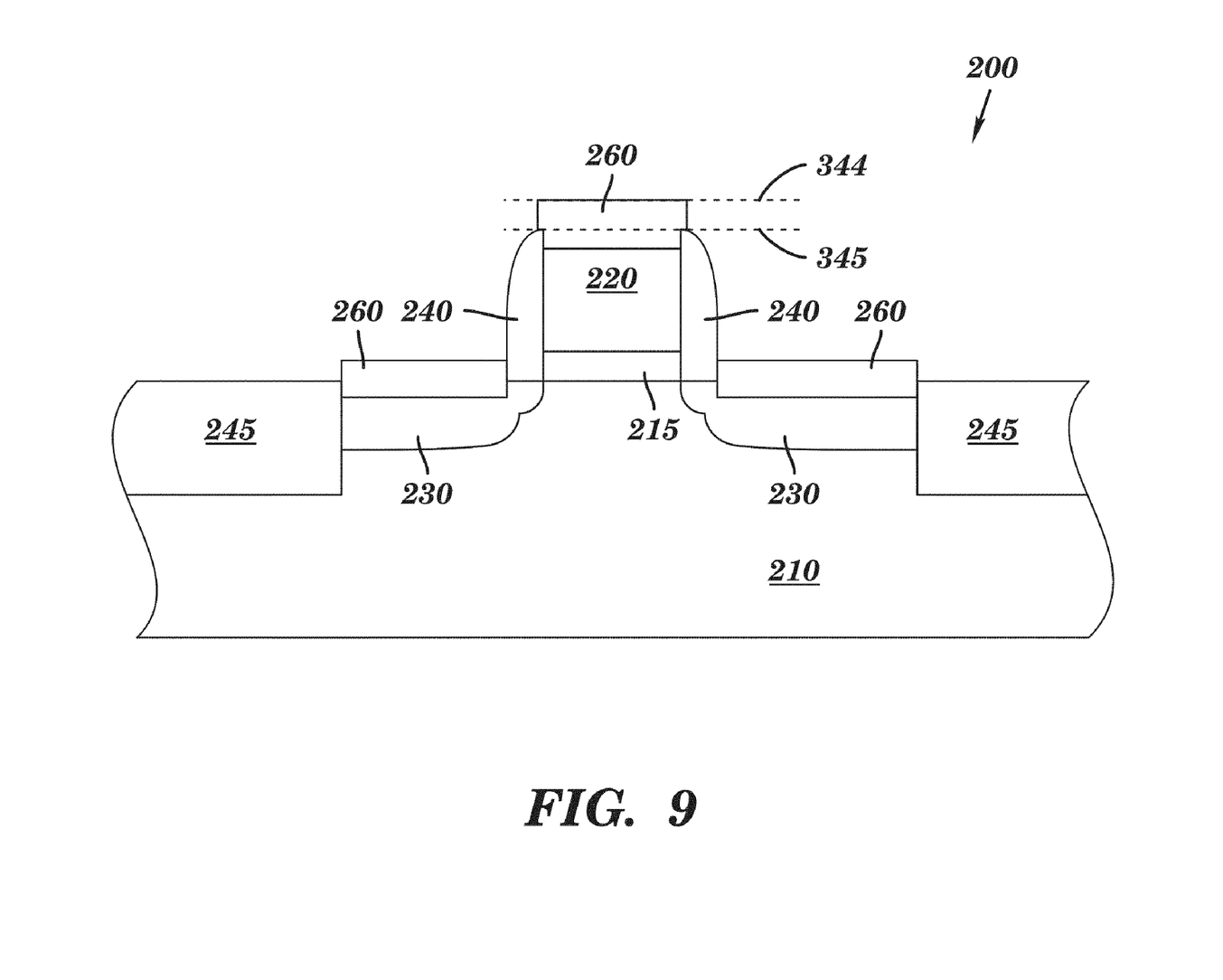

Next, a formation anneal is performed to form a monosilicide, where a silicide is an alloy of a semiconductor material and a metal. The formation anneal may be performed using a single step rapid thermal anneal (RTA). Preferably, a two-step formation anneal is performed. In the first formation anneal step, the wafer is annealed at a temperature in the range 250° C. to 350° C., and preferably in the range 280° C. to 320° C. The first formation anneal step results in partially silicided regions (not shown) (i.e. a partial reaction of the metal layer 250 with the underlying semiconductor of the gate conductor 220 and the source/drain regions 230), but not enough to fully form the $Ni_{1-x}Pt_xSi$ monosilicide. The partially silicided regions do not form over the dielectric sidewalls 240 or over the STI regions 245. Next, a second formation anneal step is performed to complete the formation of the monosilicide layer 260, i.e. $Ni_{1-x}Pt_xSi$. The second formation anneal step may be performed at a temperature in the range 360° C. to 450° C., and preferably in the range 400° C. to 420° C. The resulting structure is illustrated in FIG. 8. The unreacted portions of the metal layer 250 may be selectively removed, for example, by methods such as wet chemical etch, preferably by sulfuric peroxide. Optionally, the unreacted portions of the metal layer 250 may be selectively removed after a first, partial, formation anneal step. The resulting structure after removal of the unreacted portions of the metal layer 250 is illustrated in FIG. 9. In FIG. 9, after the formation anneal, the Pt may be segregated towards the top of the silicide 260, that is, about 50% or more of the Pt will be concentrated in the upper 50% of the silicide region between the top of the silicide 260 (indicated by the dashed line 344) and the spacer pulldown height 345.

Figure 10:
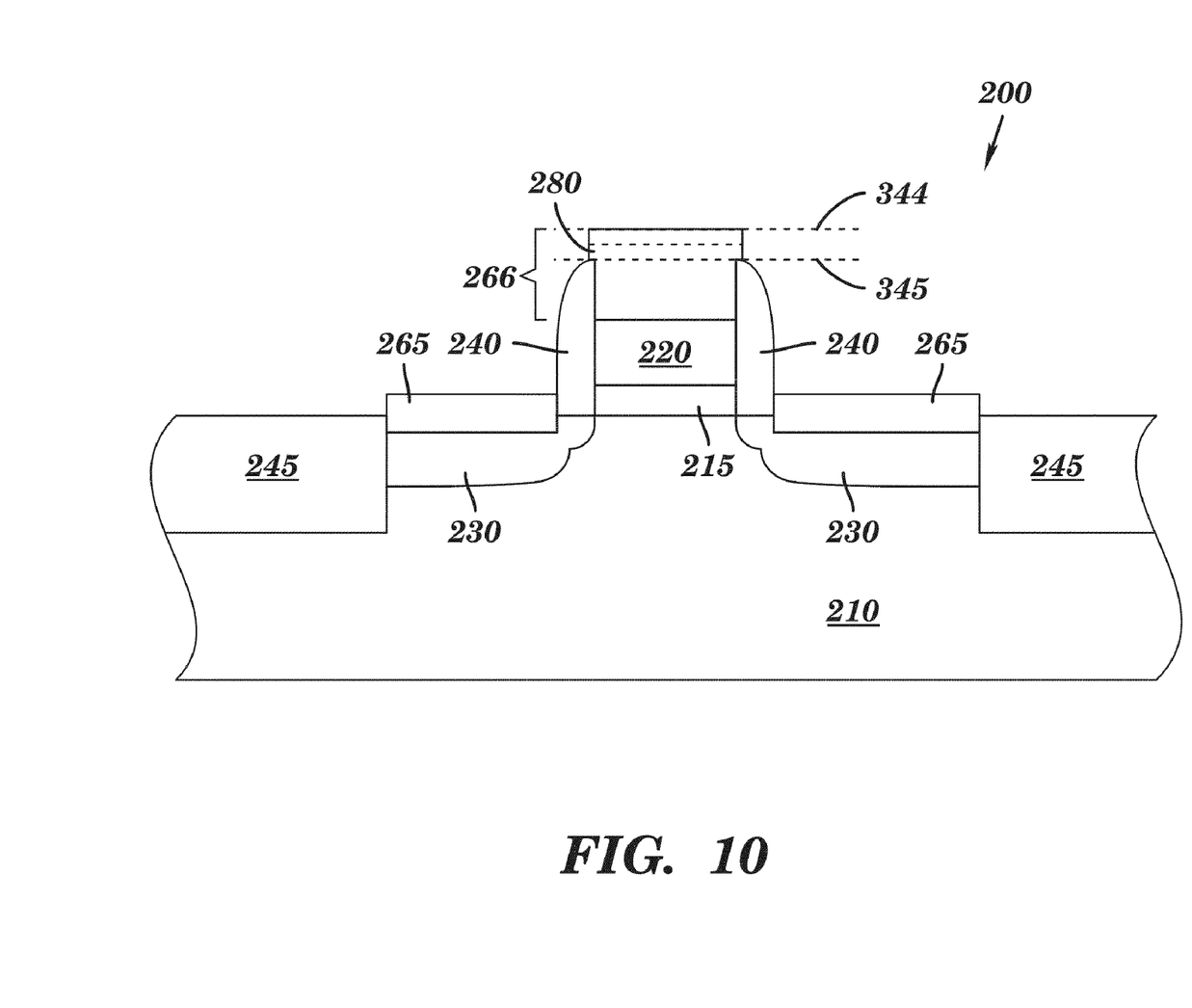

Next, in accordance with the invention, a segregation anneal step is performed, which has a higher thermal budget than the formation anneal steps. The segregation anneal step is performed at a temperature and period of time to form a segregated silicide 266 so that the Pt segregates from the $Ni_{1-x}Pt_xSi$ silicide, but at a low enough temperature budget that the silicide will not agglomerate. The segregation anneal step is preferably performed at a temperature in the range 450-550° C. Applicants have unexpectedly discovered that, for gate conductors having widths less than about 65 nm, after the segregation anneal step, at least 50% of the Pt in the silicide 266 is located in a segregated region towards the pulldown spacer height 345. The Pt is segregated in the lower half 280 of the portion of the segregated silicide 266 between the top 344 of the silicide 266 and the pulldown spacer height 345, as illustrated in FIG. 10. The width of the vertical distribution of Pt atoms in the segregated Pt region 280 at half the peak Pt concentration (full width at half-maximum or FWHM) is less than 50% of the distance between the top 344 of the silicide 260 to the pulldown spacer height 345. Note that the bottom of the silicide 266 may be extended further into the gate stack 220 after the segregation anneal.

Figure 11A:
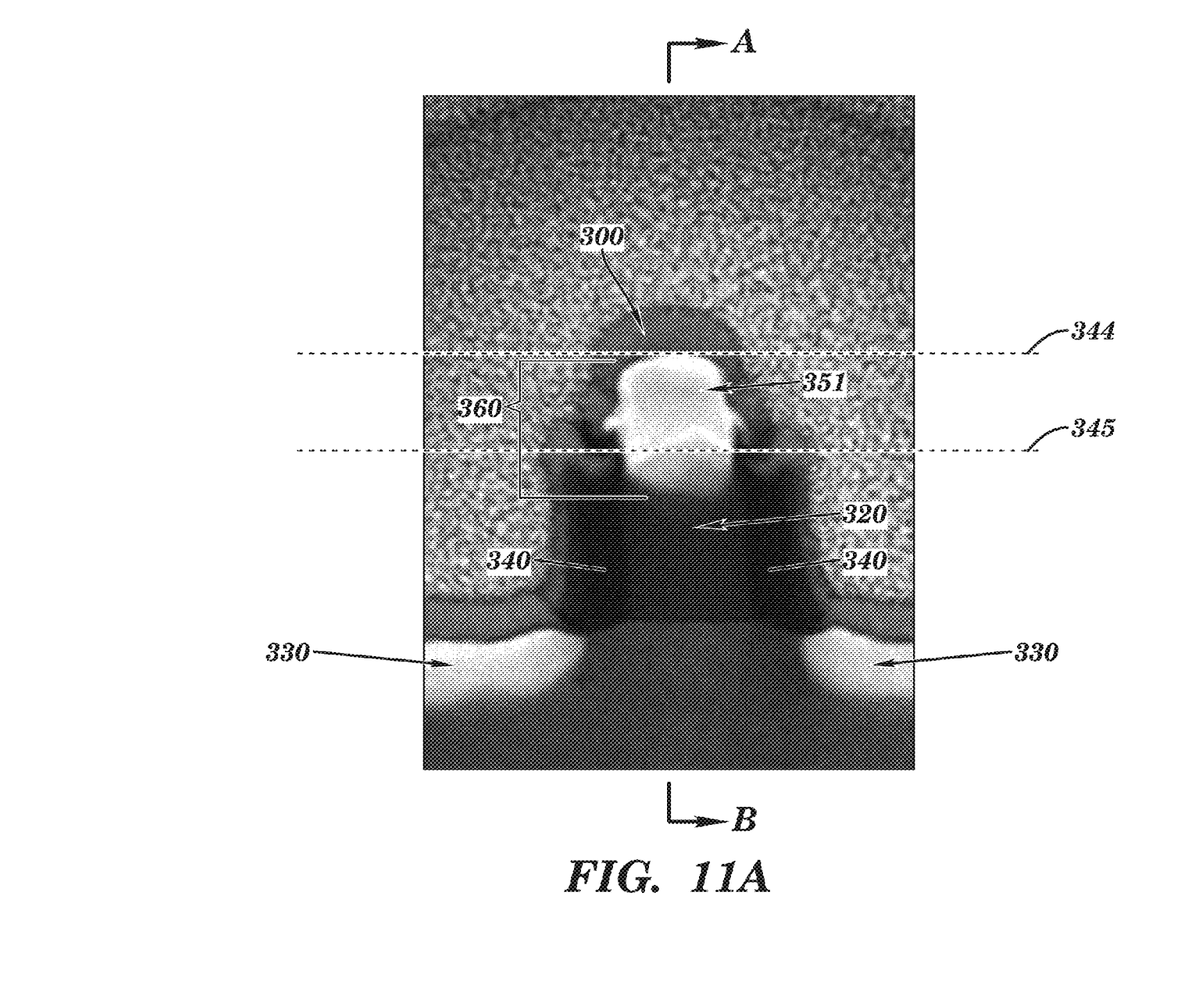
FIG. 11A illustrates a TEM image of a gate stack after a formation anneal.
Figure 11B:
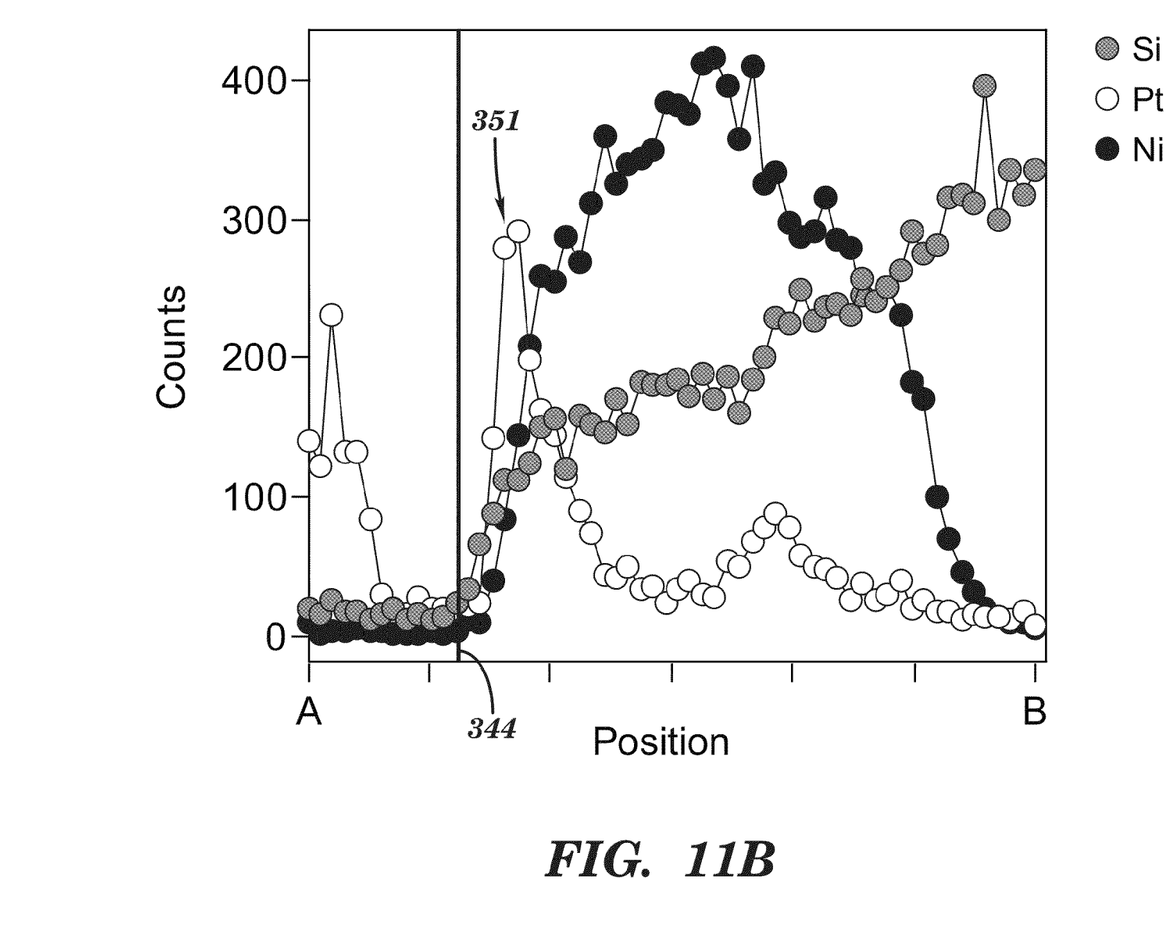
FIG. 11B illustrates a plot showing Pt composition as a function of position along the gate stack in FIG. 11A.

For example, FIG. 11A shows a transmission electron microscope (TEM) image of a gate stack 300 after a formation anneal (but prior to a segregation anneal). The source/drain regions 330 are indicated as white regions in the substrate adjacent the gate stack 300. The gate stack 300 includes a gate conductor 320 and sidewall spacers 340. The silicide 360 is indicated by the bright region atop the gate conductor 320. The top of the silicide 360 is indicated by the dashed line 344, and the pulldown of the spacers 340 from the top of the gate stack is approximately indicated by the dashed line 345. A plot of the Pt concentration through the gate stack 300 along the line A-B is illustrated in FIG. 11B. Note that after the formation anneal, the highest concentration of Pt 351 is segregated towards the top 344 of the silicide 360.

Figure 12A:
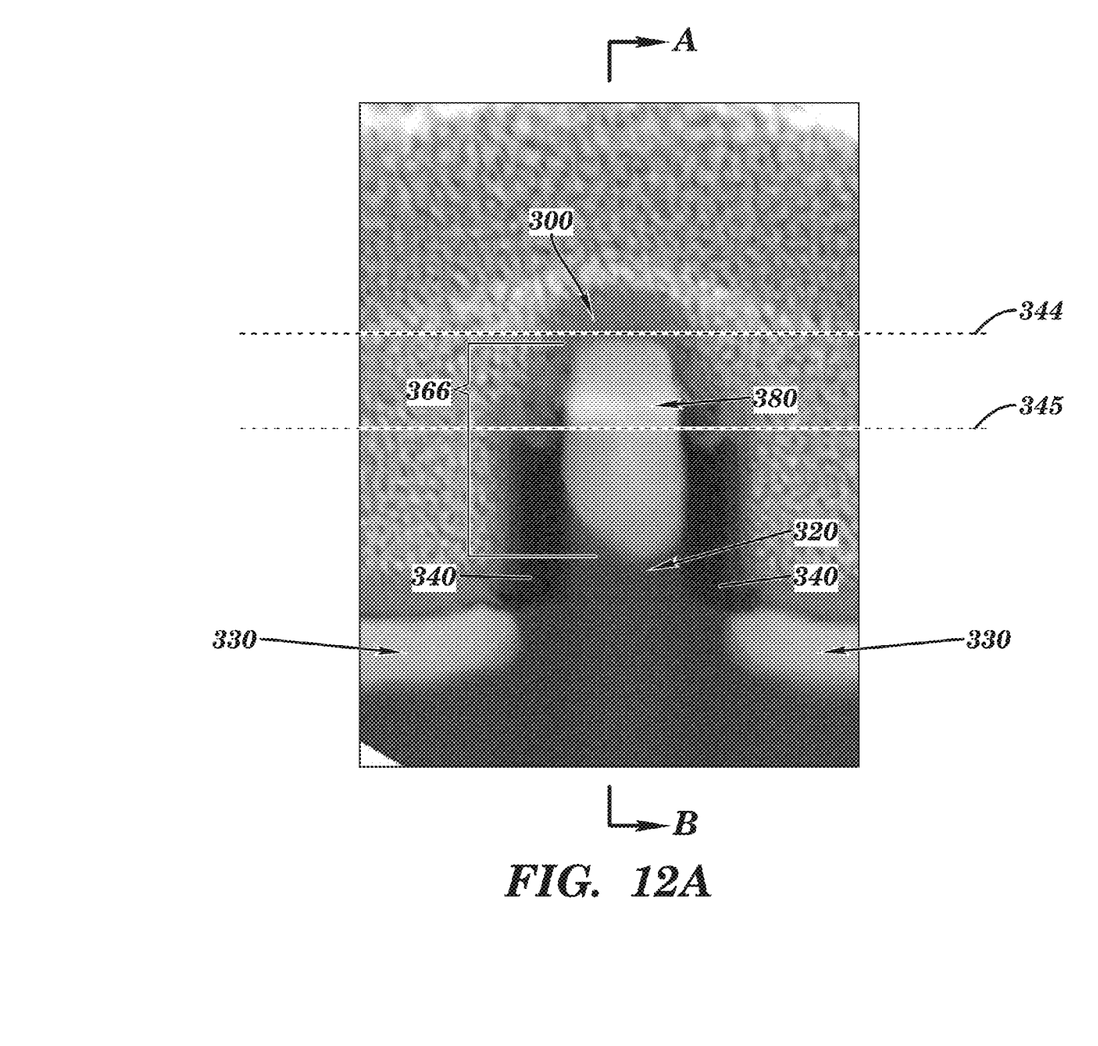
FIG. 12A illustrates a TEM image of a gate stack after a segregation anneal in accordance with the invention.
Figure 12B:
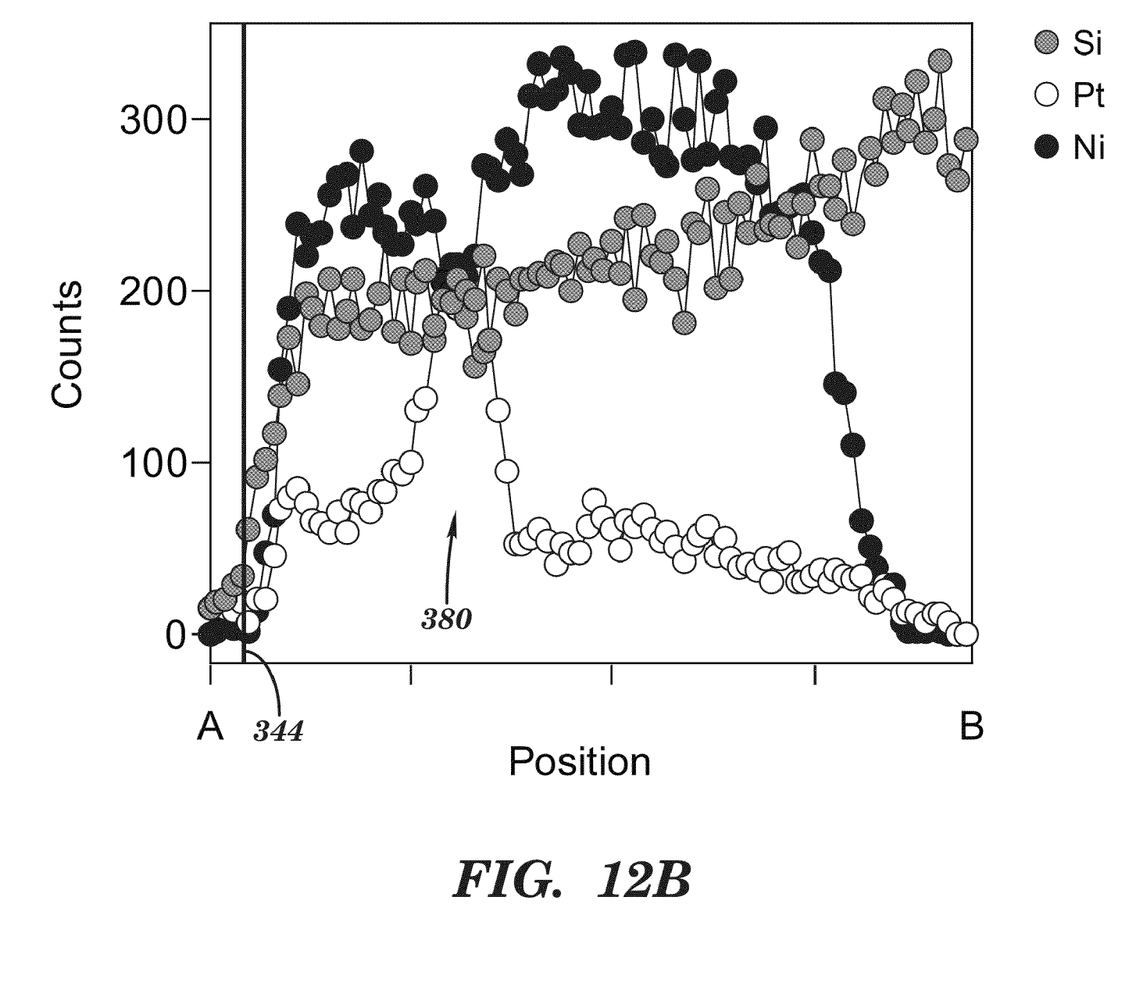
FIG. 12B illustrates a plot of Pt composition as a function of position along the gate stack imaged in FIG. 12A.

This is illustrated in FIG. 12A, showing an image of a narrow gate stack 300 after the segregation anneal step in accordance with the invention, having a silicide region 366. A chemical analysis (FIG. 12B) along the vertical length A-B of the gate stack 300 indicates that Pt has segregated in the region 380 towards the bottom portion of the silicide region 366.

However, referring to the TEM of FIG. 12A after a segregation anneal, of a narrow gate stack 300 (i.e. having a width equal to or less than about 65 nm), the resulting segregated Pt 380 will be segregated away from the top 344 of the silicide 366 and towards the bottom of the silicide 366 and at about the level 345 of the pulldown of the spacers 340. The resulting segregated silicide 366 has good thermal stability, while also having low contact and sheet resistance.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed:

1. A method for manufacturing a semiconductor device, the method comprising the steps of:
   providing a wafer comprising a semiconductor substrate, a gate stack formed atop the substrate, including a semiconductor gate conductor, having a width less than or equal to 65 nm, and dielectric spacers covering the sidewalls of the gate conductor while leaving the top surface of the gate conductor exposed;
   pulling down the dielectric spacers to expose an upper portion of the sidewalls of the semiconductor gate conductor to a pulldown spacer height;
   forming a thin metal layer over the wafer at least atop the exposed top surface and upper portion of the sidewalls of the semiconductor gate conductor, the thin metal layer comprising Ni and Pt;
   performing a formation anneal so that the thin metal layer reacts with the gate conductor to form a monosilicide layer;
   removing unreacted portions of the thin metal layer; and
   after removing said unreacted portions of the thin metal layer, performing a segregation anneal at a higher temperature than the formation anneal so that at least 50% of the Pt is located in a segregated region in a lower half of said monosilicide layer between a top surface of said monosilicide layer and said pulldown spacer height.

2. The method according to claim 1, wherein said thin metal layer comprises at least 5 percent Pt.

3. The method according to claim 1, wherein said formation is performed at a temperature in the range 250° C. to 450° C.

4. The method according to claim 1, wherein said formation anneal further comprises a two-step formation anneal.

5. The method according to claim 4, wherein the first of said two-step formation anneal is performed at a temperature in the range 250° C. to 350° C.

6. The method according to claim 4, wherein the second step of said two-step formation anneal is performed at a temperature in the range 360° C. to 450° C.

7. The method according to claim 4, wherein said step of removing unreacted portions of the thin metal layer is performed after the first step of said two-step formation anneal.

8. The method according to claim 1, wherein said segregation anneal is performed at a temperature in the range 450° C. to 550° C.

9. The method according to claim 1, wherein said dielectric spacers have a width that is at least one-tenth the thickness of said gate conductor.

10. The method according to claim 1, wherein said formation anneal is performed using a single step rapid thermal anneal.

11. The method according to claim 1, wherein the distribution of Pt along the vertical length of said monosilicide layer has a peak concentration within said segregated region, and said segregated region has a width at half said peak concentration that is less than 50% of the distance between said top surface of said monosilicide layer and said pulldown spacer height.

12. The method according to claim 1, wherein said thin metal layer has a thickness so that all of the semiconductor gate conductor above the pulldown spacer height is consumed during said formation anneal.

13. The method according to claim 1, wherein said thin metal layer has a thickness and said exposed upper portion of the sidewalls of the semiconductor gate conductor has a height at least as large as the thickness of said thin metal layer.

14. A method for manufacturing a semiconductor device, the method comprising the steps of:
   providing a wafer comprising a semiconductor substrate, a gate stack formed atop the substrate, including a semiconductor gate conductor, having a width less than or equal to 65 nm, and dielectric spacers covering the sidewalls of the gate conductor while leaving the top surface of the gate conductor exposed;
   pulling down the dielectric spacers to a pulldown spacer height;
   forming a thin metal layer over the wafer at least atop the exposed top surface and upper portion of the sidewalls of the gate conductor, the thin metal layer comprising a nickel and a second metal;
   performing a formation anneal so that the thin metal layer reacts with the gate conductor to form a monosilicide layer;
   removing unreacted portions of the thin metal layer; and
   after removing said unreacted portions of the thin metal layer, performing a segregation anneal at a higher temperature than the formation anneal so at least 50% of the second metal is located in a segregated region in a lower half of said monosilicide layer between a top surface of said monosilicide layer and said pulldown spacer height.

15. The method according to claim 14, wherein said second metal is selected from the group comprising Pt, Pd and Re.

16. The method according to claim 14, wherein said second metal comprises at least 5 percent Pt.

17. The method according to claim 14, wherein said dielectric spacers have a width that is at least one-tenth of the thickness of said gate conductor.

18. The method according to claim 14, wherein said pulldown spacer height is a height at which the thickness of said spacer is at least one-tenth of the thickness of said gate conductor.

19. The method according to claim 14, wherein the distribution of said second metal along the vertical length of said monosilicide layer has a peak concentration within said segregated region, and said segregated region has a width at half said peak concentration that is less than 50% of the distance between said top surface of said monosilicide layer and said pulldown spacer height.

20. The method according to claim 14, wherein said formation is performed at a temperature in the range 250° C. to 450° C.

21. The method according to claim 14, wherein said formation anneal further comprises a two-step formation anneal.

22. The method according to claim 21, wherein the first of said two-step formation anneal is performed at a temperature in the range 250° C. to 350° C.

23. The method according to claim 21, wherein the second step of said two-step formation anneal is performed at a temperature in the range 360° C. to 450° C.

24. The method according to claim 21, wherein said step of removing unreacted portions of the thin metal layer is performed after the first step of said two-step formation anneal.

25. The method according to claim 14, wherein said segregation anneal is performed at a temperature in the range 450° C. to 550° C.

26. The method according to claim 14, wherein said formation anneal is performed using a single step rapid thermal anneal.

27. The method according to claim 14, wherein said thin metal layer has a thickness so that all of the semiconductor gate conductor above the pulldown spacer height is consumed during said formation anneal.

28. The method according to claim 14, wherein said thin metal layer has a thickness and said exposed upper portion of the sidewalls of the semiconductor gate conductor has a height at least as large as the thickness of said thin metal layer.

29. An integrated circuit device comprising:
a gate stack comprising:
a semiconductor gate conductor having a width of 65 nm or less;
dielectric spacers on the sidewalls of said semiconductor gate conductor having a pulldown height at a height where a thickness of said dielectric spacers is at least one-tenth of the width of said semiconductor gate conductor; and
an alloy layer of said semiconductor gate conductor material and a first and second metals, said alloy layer disposed atop said semiconductor gate conductor and having a segregated region comprising at least 50% of the concentration of said second metal within said alloy layer located in a lower half of a portion of said alloy layer between a top surface of said alloy layer and said pulldown height.

30. The integrated circuit device according to claim 29, wherein said alloy layer is a monosilicide comprising Ni, Pt and Si.

* * * * *